United States Patent [19]

Hsu et al.

[11] Patent Number: 5,753,525

[45] Date of Patent: May 19, 1998

[54] METHOD OF MAKING EEPROM CELL WITH IMPROVED COUPLING RATIO

[75] Inventors: Louis Lu-Chen Hsu, Fishkill; Seiki Ogura, Wappingers Falls, both of N.Y.; James Peng, Santa Maria, Calif.

[73] Assignee: International Business Machines Corporation, Armonk, N.Y.

[21] Appl. No.: 579,025

[22] Filed: Dec. 19, 1995

[51] Int. Cl.$^6$ .............................................. H01L 21/8247
[52] U.S. Cl. ...................... 437/43; 437/52; 257/316
[58] Field of Search ...................... 437/43, 52; 257/316

[56] References Cited

U.S. PATENT DOCUMENTS

| | | | |
|---|---|---|---|
| 4,209,849 | 6/1980 | Schrenk | 365/182 |
| 4,757,360 | 7/1988 | Faraone | 357/23.5 |
| 4,812,885 | 3/1989 | Riemenschneider | 357/23.5 |
| 5,019,879 | 5/1991 | Chiu | 357/23.5 |
| 5,091,326 | 2/1992 | Haskell | 437/43 |
| 5,095,344 | 3/1992 | Harari | 357/23.5 |
| 5,111,270 | 5/1992 | Tzeng | 357/23.5 |
| 5,138,573 | 8/1992 | Jeuch | 365/182 |
| 5,198,380 | 3/1993 | Harari | 437/43 |
| 5,210,044 | 5/1993 | Yoshikawa | 437/43 |
| 5,310,693 | 5/1994 | Hsue | 437/43 |
| 5,315,142 | 5/1994 | Acovic et al. | 257/316 |
| 5,464,999 | 11/1995 | Bergemont | 257/322 |
| 5,468,663 | 11/1995 | Bertin et al. | 437/43 |
| 5,498,560 | 3/1996 | Sharma et al. | 437/43 |
| 5,541,130 | 7/1996 | Ogura et al. | 437/43 |
| 5,583,066 | 12/1996 | Jung | 437/43 |

Primary Examiner—John Niebling
Assistant Examiner—Richard A. Booth
Attorney, Agent, or Firm—Charles W. Peterson, Jr.

[57] ABSTRACT

A method of forming EEPROM cells. The method includes forming a tunnel oxide layer on a wafer and forming floating gates on the tunnel oxide layer with the floating gate having sidewalls. Isolation regions may be formed adjacent the sidewalls. A conformal ONO layer of dielectric is formed on the floating gate and sidewalls, using Chemical Vapor Deposition. Next, a selective etch material layer is deposited on the wafer over the conformal dielectric layer. A polish stop layer is deposited on the wafer over the selective etch material layer to define an upper polishing surface above the floating gate. The exposed polish stop layer and underlying selective etch material are removed by depositing an oxide layer on the polish stop layer and then polishing the deposited layer coplanar with the polish stop layer which is an upper polishing surface above the floating gates. Exposed portions of the polish stop layer are removed to expose the selective etch layer above the floating gates and above sidewall regions adjacent the sidewalls. Then, the exposed selective etch layer is removed, exposing the conformal dielectric layer. Finally, a control gate may be formed by depositing a control gate layer above the floating gate and within the sidewall region and patterning the control gate layer. The patterned control gates extend over the floating gate and along the floating gate sidewalls. The control gate-floating gate capacitor area includes the floating gate sidewalls.

30 Claims, 3 Drawing Sheets

METHOD OF MAKING EEPROM CELL WITH IMPROVED COUPLING RATIO

FIELD OF THE INVENTION

The present invention generally relates to electronic memory structures and, more particularly, to electrically erasable programmable read only memories (EEPROMs) formed at high integration density.

BACKGROUND OF THE INVENTION

Electrically Programmable Read-Only Memories (EPROMs) and Electrically Erasable Programmable Read-Only Memories (EEPROMs) are well known in the art. More particularly, in recent years, EEPROMs, known as flash memories, have a provision for erasing and rewriting individual sections or partitions, independently, while stored data is maintained in other sections.

EEPROMs in general have many applications ranging from personalization of communications devices or storage of bar codes. Flash memories are touted as a possible replacement for system fixed disks, particularly in laptop, notebook or smaller personal computers.

FIG. 1 is a cross sectional representation through an array area of a prior art EEPROM cell. On the substrate 10, cells are identified by a floating gate 12 between two isolation diffusions 14. There is a gate oxide layer 16 between the substrate 10 and the floating gates 12. The floating gates 12 are isolated from each other by thick oxide 18. A composite silicon Oxide-silicon Nitride-silicon Oxide (ONO) dielectric layer 20 separates the floating gates 12 from an overlying control gate 22.

Data is stored in EEPROM cells in a manner that is similar to a Dynamic Random Access Memory (DRAM), i.e., storing a charge on (or discharging) an isolated node. In a DRAM cell, the isolated node is a capacitor plate. In an EEPROM cell, the isolated node is a floating gate 12, which is an electrically isolated (floating) gate of a Field Effect Transistor (FET). Carriers, electrons or holes, are injected onto the floating gate 12 through gate oxide 16 or an insulating layer 20. These carriers effectively shift the FET's threshold voltage ($V_T$) by some voltage, $\delta$, to $V_{TS}=V_T+\delta$.

The control gate 22, passing over, or under, some part of the floating gate 12, is capacitively coupled to the floating gate 12. The control gate 22 voltage ($V_{CX}$) is divided between the control gate 22 to floating gate 12 capacitance $C_{CF}$ and the floating gate 12 to channel capacitance $C_{FX}$ and $V_{CX}=V_{CF}+V_{FX}$. When the control gate 22 is driven high, the floating gate is pulled high through the capacitive coupling.

In order to read correctly, $V_{CX}$ must be high enough that $V_T<V_{FX}<V_{TS}$. Thus, when the control gate is driven high, i.e., the cell is selected, in an unprogrammed (or erased) cell, $V_{FX}>V_T$, and the floating gate FET turns on; in a programmed cell, $V_{FX}<V_T+\delta$, and the floating gate FET remains off. Ideally, during a read $V_{FX}=V_{CX}$ and during a write $V_{CF}=V_{CX}$. However, practically, neither of these conditions is possible.

Writing the cell of FIG. 1, i.e., causing charge movement into the floating gate 12, is achieved by increasing voltage on the control gate 22 above the read voltage. Writing requires a minimum Write voltage $V_W$ across the injection oxide, $C_{CF}$. Thus, the minimum for $V_{CX}$ to develop $V_{CF=VW}$ depends, in large part, on the capacitive coupling ratio (or, simply, "coupling ratio") of $C_{CF}$ and $C_{FX}$. In the prior art cell of FIG. 1, $C_{FX}$ includes a significant overlap capacitance where the floating gate 12 overlaps diffusions 14, both in the thick oxide isolation regions 18 and in the thinner oxide regions immediately adjacent channels. The larger $C_{FX}$, the higher $V_{CX}$ must be in order to write, or $C_{CF}$ must be increased to maintain the coupling ratio. Further, the higher the coupling ratios, the easier it is to write.

Typically, EEPROM cells are designed to prevent inadvertent writing or erasure during a normal read. So, by design, during a read, $V_{CF}$ is always less than $V_W$ and, is as close to zero as possible. Consequently, during a write, $V_{CX}$ is normally boosted to a much higher voltage than during a read to raise $V_{CF}$ above $V_W$. However, how much $V_{CX}$ may be boosted is limited by technology. Geometric factors limit $C_{CF}$ and, therefore, $V_{CF}$. One such factor limiting $C_{CF}$ is cell area, which is a primary concern for a stacked type of EEPROM cell. Another factor limiting $C_{CF}$ is the capacitor area, i.e., the area between the intersection of the control gate 22 and the floating gate 12. Because of these limitations, $C_{CF}$ is normally much smaller than desired. Since $C_{CF}$ is directly proportional to area, increasing capacitor area increases $C_{CF}$. However, increasing capacitor area increases cell size, which is contrary to the objective of increasing the number of EEPROM cells per unit area, i.e., increasing chip density. ways are needed to increase $C_{CF}$ without increasing cell size.

PURPOSES OF THE INVENTION

It is a purpose of the invention to increase the control gate to floating gate coupling ratio in an EEPROM cell.

It is another purpose of the present invention to increase EEPROM cell density.

It is yet another purpose of the present invention to improve EEPROM cell density while increasing the cell control gate to floating gate coupling ratio.

SUMMARY OF THE INVENTION

The present invention is a method of forming EEPROM cells. The method includes forming a tunnel oxide layer on a wafer and forming floating gates on the tunnel oxide layer with the floating gate having sidewalls. Isolation regions may be formed adjacent the sidewalls. Then, a conformal layer of dielectric is formed on the floating gate and sidewalls. The conformal dielectric may be ONO deposited using Chemical Vapor Deposition. Next, a selective etch material layer is deposited on the wafer over the conformal dielectric layer. A polish stop layer is deposited on the wafer over the selective etch material layer to define an upper polishing surface above the floating gate. The polish stop layer and the selective etch material layer are selectively removed to re-expose the conformal dielectric layer along the floating gates and sidewalls. The exposed polish stop layer and underlying etch material are removed by first depositing an oxide layer on the polish stop layer and then polishing the deposited layer coplanar with the polish stop layer such that the exposed polish stop layer is an upper polishing surface above the floating gates. Exposed portions of the polish stop layer are removed to expose the selective etch layer above the floating gates and above sidewall regions adjacent the sidewalls. Then, the exposed selective etch layer is removed, exposing the conformal dielectric layer. Finally, a control gate is formed over the conformal dielectric layer. The control gate may be formed by depositing a control gate layer above the floating gate and within the sidewall region and patterning the control gate layer. The patterned control gates extend over the floating gate and along the floating gate sidewalls. The area of the floating gate-control gate capacitor includes the area of the sidewalls.

DESCRIPTION OF THE PREFERRED EMBODIMENT

FIGS. 2A-E are cross sectional representations of a preferred EEPROM cell through the steps of forming the EEPROM cell. The preferred EEPROM cell has improved floating gate coupling capacitance. The cross section is taken in a direction perpendicular to cell current flow, i.e., perpendicular to the floating gate FET's channel and between its source and drain.

Figure 1:
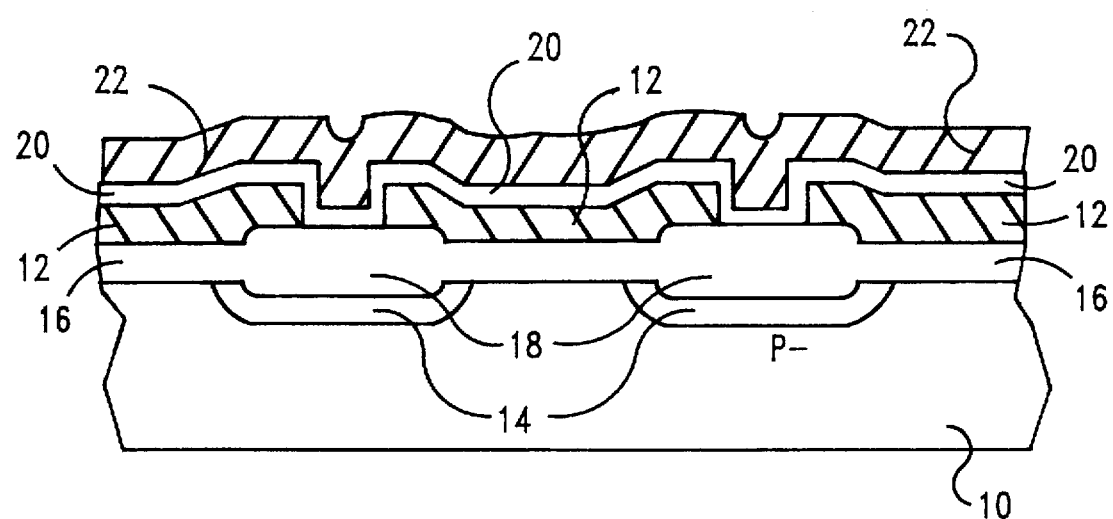
FIG. 1 is a cross sectional representation of a prior art EEPROM cell.
Figure 2A:
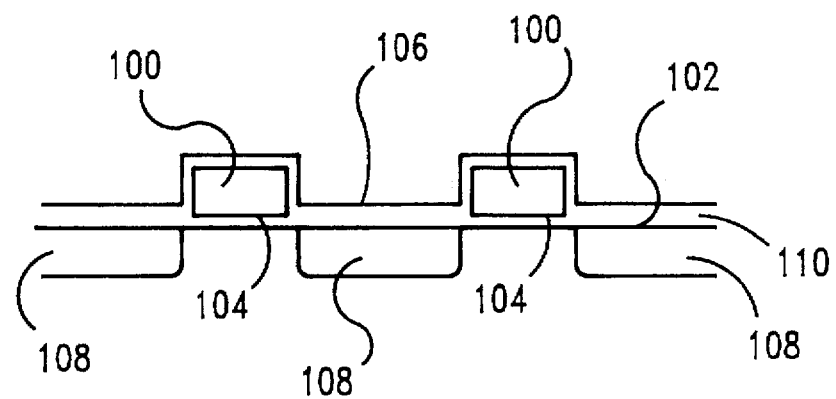
FIGS. 2A–2E represent the steps in forming an EEPROM cell according to the preferred embodiment of the present invention.

First, in preparation of a wafer, in FIG. 2A, a thin, 70 Å tunnel oxide layer 10r is formed on the surface 102 of a silicon wafer. A layer of $n^+$ doped polysilicon is deposited on the tunnel oxide layer 10r using Chemical Vapor Deposition (CVD). Floating gates 100 are formed from the polysilicon layer using a suitable photolithographic process such as are known in the art. Isolation regions 108 are formed adjacent to floating gates 100 by a p isolation implant. After the isolation implant, the floating gate photo resist pattern is removed from the polysilicon. A tunnel oxide layer 110, which is a conventional conformal ONO layer 110, is formed on the wafer covering the floating gates 100 and regions therebetween 106. The effective thickness of the conformal ONO layer is, preferably, 150 Å.

Figure 2B:
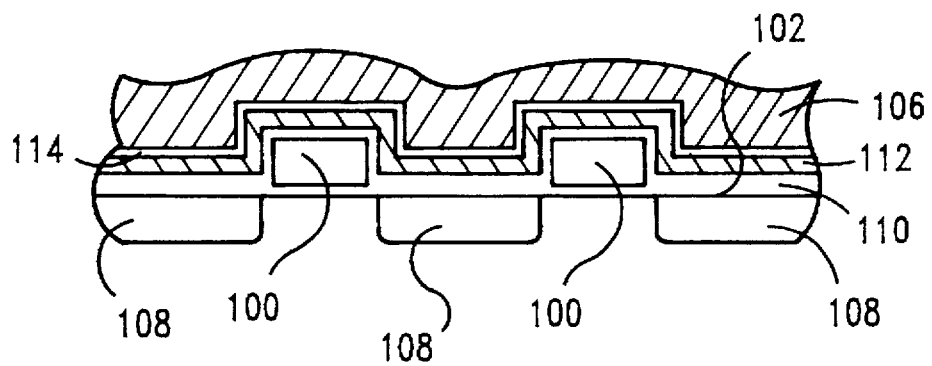

Next, in FIG. 2B, a layer 112 of selective etch material is deposited on ONO layer 110. Preferably, the selective etch material is 1500 Å thick and is boron nitride or aluminum oxide. The selective etch layer 112 is capped with a polish stop layer 114. Preferably, the polish stop layer 114 is a 1000 Å thick layer of Silicon Nitride. A layer of oxide is formed on the polish stop layer 114. Preferably, Chemical Vapor Deposition (CVD) is used to form the oxide layer 106.

Figure 2C:
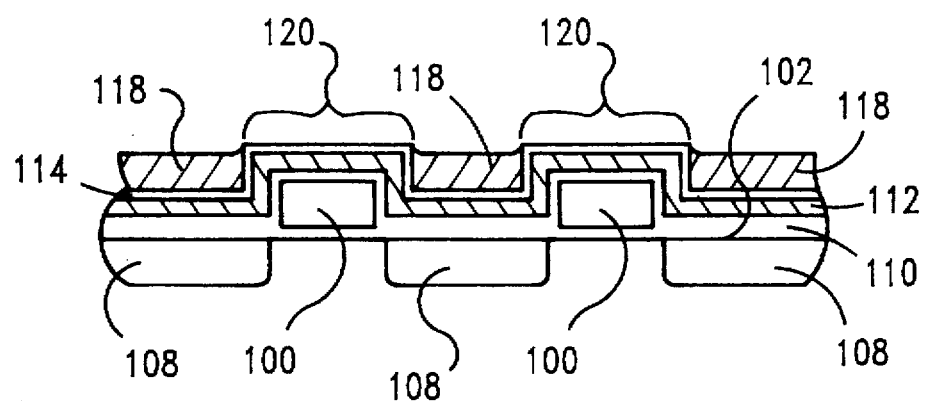

In FIG. 2C, the CVD oxide layer 106 is polished, using a typical Chemical-Mechanical Polishing (CMP) process, until the polish stop layer 114 (which forms an upper polishing surface over the floating gates 100 in areas 120) is removed. Thus, pockets of CVD oxide 118 remain only between floating gates 100 or in areas where there are no floating gates 100, i.e., outside of the array.

Figure 2D:
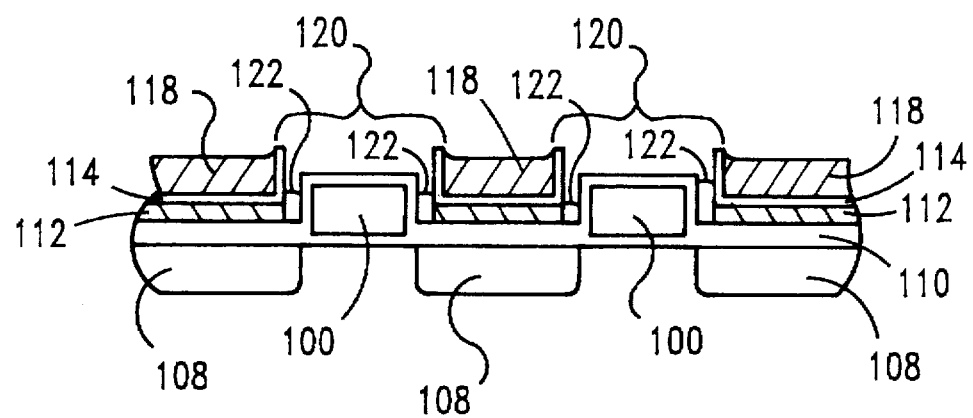

In FIG. 2D, the exposed polish stop layer 114 in areas 120 is removed by a wet or dry etch to expose the etch selective material therebeneath. Then, the exposed selective etch material is removed in areas 120 to expose ONO layer 110 on floating gates 100 and, in areas 122, along the floating gates' sidewalls 124.

Figure 2E:
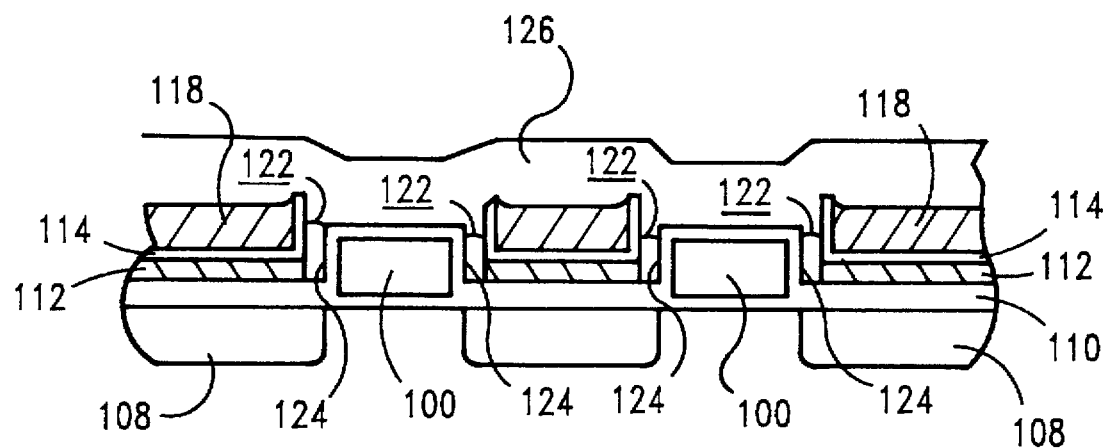

Finally in FIG. 2E, a layer 126 of $n^+$ doped poly is deposited using a well known CVD process. The deposited poly layer 126 is patterned, photolithographically, and etched to form control gates. After control gates 126 are patterned, $n^+$ regions are implanted to form sources and drains of the cells (not shown on the drawing) on either side of the control gates 126. As noted above, the cross section of FIGS. 2A–2E is taken through the cell, perpendicular to the direction of READ current flow. Thus, the source to drain (READ) current flow is perpendicular to control gates 126. Having thus completed the EEPROM cells according to the present invention, the EEPROM chip structure is completed using manufacturing steps well known in the art for such a structure.

Thus preferred EEPROM cells formed according to the steps of the present invention have a control gate to floating gate coupling ratio of at least 0.55 for a 0.3 µm thick floating gate 100. The control gate (layer 126) contacts the floating gate dielectric (ONO layer 110) vertically along the gate's sidewalls 124 as well as horizontally over the gate 100. Therefore, the EEPROM cell of the present invention has an increased coupling ratio without a corresponding decrease in cell density.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A method of forming an EEPROM cell comprising the steps of:

a) forming a first oxide layer on a wafer and forming a floating gate on the first oxide layer, said floating gate having sidewalls;

b) forming a conformal layer of dielectric on said floating gate and said sidewalls;

c) depositing a selective etch material layer on said wafer over said conformal dielectric layer;

d) depositing a polish stop layer on said wafer over said selective etch material layer, thereby defining an upper polishing surface above said floating gate;

e) selectively removing said polish stop layer and said selective etch material layer to expose said conformal dielectric layer along said floating gate and said sidewalls; and f) forming a control gate over said conformal dielectric layer, extending along said sidewalls, to form a floating gate-control gate capacitor, such that the area of the floating gate-control gate capacitor includes the area of the sidewalls.

2. The method of claim 1 whereby the step (e) of selectively removing includes the steps:

1) depositing an oxide layer on said polish stop layer and polishing said deposited oxide layer coplanar with said polish stop layer, thereby exposing said upper polishing surface above said floating gate;

2) removing exposed portions of said polish stop layer, thereby exposing said selective etch layer above said floating gate and above sidewall regions adjacent said sidewalls; and 3) removing said exposed selective etch layer,thereby exposing said conformal dielectric layer.

3. The method of claim 1 wherein the step (f) of forming the control gate comprises the steps of:

1) depositing a control gate layer above said floating gate and along said sidewalls; and 2) patterning said control gate layer, thereby defining a control gate extending over said floating gate and within said sidewall regions.

4. The method of claim 1 wherein the first oxide layer is a tunnel oxide layer having a thickness of 40 Å.

5. The method of claim 1 wherein the conformal dielectric layer is an ONO layer.

6. The method of claim 5 wherein said ONO layer effective thickness is 150 Å.

7. The method of claim 1 wherein the selective etch material is boron nitride.

8. The method of claim 1 wherein the selective etch material is aluminum oxide.

9. The method of claim 1 wherein the polish stop layer is a layer of silicon nitride.

10. The method of claim 2 wherein the oxide layer is deposited using chemical vapor deposition.

11. The method of claim 2 wherein in the step (2) of removing exposed portions, the polish stop layer is wet etched away.

12. The method of claim 2 wherein in the step (2) of removing exposed portions, the polish stop layer is dry etched away.

13. The method of claim 1 wherein the floating gate is polysilicon and the control gate is $n^+$ doped polysilicon.

14. The method of claim 1 wherein the step (a) of forming the first oxide layer and the floating gate further includes forming isolation regions adjacent said sidewalls.

15. A method of forming an array of EEPROM cells, said method comprising the steps of:
 a) forming a tunnel oxide layer on a wafer and forming an array of floating gates on the tunnel oxide layer, each of said floating gates having sidewalls and, forming isolation regions adjacent said sidewalls;
 b) forming a conformal ONO layer on said floating gates and along said sidewalls;
 c) depositing a selective etch material layer on said wafer over said conformal ONO layer;
 d) depositing a polish stop layer on said wafer over said selective etch material layer, thereby defining an upper polishing surface above said floating gate;
 e) depositing a dielectric layer on said polish stop layer and polishing said deposited dielectric layer coplanar with said polish stop layer, thereby exposing said upper polishing surface above said floating gates;
 f) removing exposed portions of said polish stop layer, thereby exposing said selective etch layer above said floating gates and above sidewall regions adjacent said sidewalls;
 g) removing said exposed selective etch layer, thereby exposing said conformal ONO layer on said floating gate and along said sidewalls; and
 h) forming a plurality of control gates over said conformal ONO layer extending along said sidewalls to form at least one floating gate-control gate capacitor, such that with said each floating gate the area of the floating gate-control gate capacitor includes the area of the sidewalls.

16. The method of claim 15 wherein the step (h) of forming the plurality of control gates comprises the steps of:
 1) depositing a control gate layer above said floating gates and along said sidewalls; and
 2) patterning said control gate layer, thereby defining said plurality of control gates extending over said floating gates and along said sidewalls.

17. The method of claim 16 wherein said ONO layer has an effective thickness of 150 Å.

18. The method of claim 17 wherein said tunnel oxide layer has a thickness of 40 Å.

19. The method of claim 18 wherein selective etch material is boron nitride.

20. The method of claim 18 wherein the selective etch material is aluminum oxide.

21. The method of claim 18 wherein the polish stop layer is a layer of silicon nitride.

22. The method of claim 21 wherein the deposited dielectric layer is an oxide layer and i deposited using chemical vapor deposition.

23. The method of claim 22 wherein in the step (f) of removing exposed portions, the polish stop layer is wet etched away.

24. The method of claim 22 wherein in the step (f) of removing exposed portions, the polish stop layer is dry etched away.

25. The method of claim 22 wherein the floating gate is doped polysilicon and the control gate layer is $n^+$ doped polysilicon.

26. A method of forming an array of EEPROM cells, said method comprising the steps of:
 a) forming a tunnel oxide layer on a wafer and forming an array of floating gates on the tunnel oxide layer, each of said floating gates having sidewalls, and forming isolation regions adjacent said sidewalls;
 b) forming a 150 Å thick conformal ONO layer on said floating gates and said sidewalls;
 c) depositing a selective etch material layer on said wafer over said conformal ONO layer;
 d) depositing a polish stop layer of silicon nitride on said wafer over said selective etch material layer, thereby defining an upper polishing surface above said floating gates;
 e) depositing an oxide layer on said polish stop layer using chemical vapor deposition (CVD) and polishing said CVD oxide layer coplanar with said polish stop layer, thereby exposing said upper polishing surface above said floating gates;
 f) removing exposed portions of said polish stop layer, thereby exposing said selective etch layer above said floating gates and above sidewall regions adjacent said sidewalls;
 g) removing said exposed selective etch layer, thereby exposing said conformal ONO layer on said floating gates and along said sidewalls; and
 h) forming control gates over said conformal ONO layer extending along said sidewalls, said control gates formed by:
  1) depositing a control gate layer of n+ doped polysilicon above said floating gates and within said sidewall regions,
  2) and patterning said control gate layer, thereby defining control gates extending over said floating gates and within said sidewall regions such that the area of floating gate-control gate capacitors include the area of the sidewalls, and
  3) implanting to form sources and drains of the cells.

27. The method of claim 26 wherein the selective etch material is boron nitride.

28. The method of claim 26 wherein the selective etch material is aluminum oxide.

29. The method of claim 26 wherein in the step (f) of removing exposed portions, the polish stop layer is wet etched away.

30. The method of claim 26 wherein in the step (f) of removing exposed portions, the polish stop layer is dry etched away.

* * * * *